United States Patent
Arndt et al.

(10) Patent No.: US 6,232,564 B1
(45) Date of Patent: May 15, 2001

(54) PRINTED WIRING BOARD WIREABILITY ENHANCEMENT

(75) Inventors: Steven Frederick Arndt, Endwell; Mark Budman, Vestal; James Richard Stack, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/169,693

(22) Filed: Oct. 9, 1998

(51) Int. Cl.⁷ ...................................................... H05K 1/11
(52) U.S. Cl. ........................ 174/266; 174/255; 174/261; 361/777; 361/794
(58) Field of Search ................................. 174/255, 261, 174/262, 265, 266; 257/679, 700; 361/760, 777, 792, 794, 795

(56) References Cited

U.S. PATENT DOCUMENTS

| | | | |
|---|---|---|---|
| 4,298,770 | 11/1981 | Nishihara et al. | 174/262 |
| 4,791,238 | 12/1988 | Kanno et al. | 174/266 |
| 5,438,166 | 8/1995 | Carey et al. | 174/261 |
| 5,477,082 | * 12/1995 | Buckley, III et al. | 257/679 |
| 5,496,971 | 3/1996 | Moriizumi et al. | 174/255 |
| 5,708,569 | * 1/1998 | Howard et al. | 361/760 |
| 5,784,262 | * 7/1998 | Sherman | 361/777 |

OTHER PUBLICATIONS

Layden, E.C., "Use of Relatively Diagonal and Rectangular Wiring Planes in Multiplayer Packages," IBM Technical Disclosure Bulletin, vol. 14, No. 4, pp. 1316–1317, Sep. 1971.

Kutch, G., "Edge Definition as Related to Angled Electrode Lands," IBM Technical Disclosure Bulletin, vol. 13, No. 12, p. 3653, May, 1971.

* cited by examiner

Primary Examiner—Hyung-Sub Sough
(74) Attorney, Agent, or Firm—Schmeiser, Olsen & Watts; Lawrence R. Fraley

(57) ABSTRACT

A printed circuit board having a signal plane with increased channel width for enhanced wireability. The printed circuit board has a top plane having component lands arranged in a grid, wherein the component lands include a first grouping arranged in a first diagonal, and a second grouping arranged in a second diagonal where the second diagonal is parallel and adjacent to the first diagonal, a plurality of offset lands placed within the first diagonal between the component lands therein, and a plurality of electrical connectors electrically coupling component lands in the second diagonal to adjacent offset lands in the first diagonal.

18 Claims, 5 Drawing Sheets

PRINTED WIRING BOARD WIREABILITY ENHANCEMENT

BACKGROUND OF THE INVENTION

1. Technical Field

The present invention relates to printed wiring boards, and more particularly relates to a wireability enhancement for use on printed wiring boards.

2. Related Art

Printed wiring boards, circuit boards, and cards (hereinafter "PCB's") typically comprise a plurality of "horizontally oriented" layers which include one or more "inner" signal planes (hereinafter "signal planes") that include wiring patterns for delivering signals to various points along a horizontal plane within the PCB, a top plane for receiving components which, like the signal planes, may also include wiring patterns (i.e., the top plane may technically be considered an "outer" signal plane capable of delivering signals to various points on the top plane), and one or more power planes for providing power to various points on the PCB. Connections between and among the signal planes and top plane are made with vertical connections between conductive points or "lands," which reside on the surface of each plane. The vertical connections, referred to as vias, are often implemented as plated through holes (PTH's).

With the advent of more and more complex PCB's, demands have been placed on signal plane designs to provide higher wiring densities or "wireability" in order to service the increasingly complex componentry on the top plane of such PCB's. Accordingly, the wireability of PCB's depends upon the size of the lands, the width of the wire, the space between the wires, the number of signal planes, and the distance between lands. The typical solution for achieving higher density wiring involves either shrinking of the size of the features on the PCB or increasing the number of signal planes. Unfortunately, these solutions generally lead to increased complexity and cost, and almost always adversely affect the PCB's electrical performance.

Assuming additional signal planes cannot be utilized, and it is impractical to further reduce the wire and land size, present designs for signal planes are strictly limited by a fixed channel width. This limitation is described with reference to a simplified example shown in FIGS. 1 and 2. FIG. 1 depicts an example of a top plane 10 of a multi-layered printed circuit board. The top plane 10 comprises a plurality of component lands 12 for receiving componentry, such as pseudo-component 18. As noted, the top plane 10 could also comprise wiring (not shown) between and among the lands 12. The component lands 12, in this case, are spaced in a predetermined pattern. In this case, the pattern is a grid pattern commonly used in the art, such as that implemented with a ball grid array (BGA). Each component land 12 generally comprises a conductive area 14 for receiving a component lead or wire connection, and a via or plated through hole 16 for providing vertical connections to different layers of the PCB. The component lands 12 are generally arranged in a predetermined manner such that each land has a uniform spacing "x" with adjacent lands. Such a predetermined arrangement of lands is preferable because it allows for the easy attachment of components on the PCB. For example, pseudo-component 18 is shown with a plurality of connectors 20 located at predetermined positions that will readily match up with the component lands on the PCB. Consequently, if the arrangement of the circuit lands on the PCB were to be altered, the geometry of the components that are to be attached to the PCB would likewise need to be altered. Such an alteration would clearly be impractical as componentry, which typically comes from many different sources, must adhere to predetermined size specifications. Accordingly, PCB designs are generally required to conform to a particular arrangement with respect to the placement of component lands on the top plane.

In order to deliver a complex network of signals between and among components residing on a top plane of a PCB, an inner signal plane 21 such as that shown in FIG. 2 must be utilized. For each component land 12 on the top plane 10, a corresponding signal land 13 on a signal plane 21 generally exists directly below the corresponding component land 12. A via or PTH may then be used to interconnect the corresponding lands on different planes as required by the particular design. Accordingly, the arrangement of signal lands on the signal plane must generally coincide with the arrangement of component lands on the top plane. Thus, as depicted in FIG. 2, the arrangement of signal lands 13 on the signal plane 21 duplicates the grid depicted on the top plane 10 of FIG. 1. Because wiring on the signal plane 21 must be routed between signal lands 13, the wiring must pass within a channel space 22 having a maximum width of "x." Therefore, as can be seen in FIG. 2, the wiring density 23 on the signal plane 21 is generally limited by a width "x," which directly results from the arrangement of the component lands 12 on the top plane 10.

As noted, given the need for a standard component geometry, the state-of-the-art dictates that the distance between the component lands 12 must be fixed. Accordingly, the wireability on a signal plane 21 has heretofore been limited by the fixed channel width available on the signal plane. Without some method of easily increasing the channel width size in signal plane designs, printed circuit boards will continue to have limited wiring densities.

SUMMARY OF THE INVENTION

The present invention overcomes the above-mentioned problems in the art by providing a multi-planed wiring board, comprising: (1) a signal plane having a plurality of signal lands positioned for enhanced wireability; (2) a top plane located in a co-planar manner above the signal plane and having a plurality of component lands positioned for receiving components of a standard geometry, wherein each component land on the top plane has a corresponding signal land on the signal plane, and wherein a subset of the signal lands on the signal plane do not reside directly below their corresponding component lands (i.e., they are horizontally offset for enhanced wireability); (3) a plurality of auxiliary lands located on the top plane, wherein the auxiliary lands are directly above the subset of horizontally offset signal lands; and (4) a plurality of horizontal connections electrically coupling auxiliary lands to component lands.

In addition, multiple auxiliary lands may be clustered together with a single component land on the top plane to prevent the fragmentation of the power plane. Fragmentation of the power plane is avoided since cluster will cause the required clearance holes in the power plane to overlap and therefore occupy less area.

It is therefore an advantage of the present invention to provide increased wireability within a signal plane without changing the geometry of the components on the PCB.

It is therefore a further advantage of the present invention to provide auxiliary lands on a top plane of a PCB to allow signal lands on a signal plane to be arranged for enhanced wireability.

It is therefore a further advantage of the present invention to cluster lands on a PCB in order to avoid the fragmentation of the power plane.

The foregoing and other objects, features and advantages of the invention will be more apparent in the following and more particular description of the preferred embodiments of the invention as illustrated in the accompanying drawings.

BRIEF DESCRIPTION OF DRAWINGS

The preferred exemplary embodiment of the present invention will hereinafter be described in conjunction with the appended drawings, where like designations denote like elements and.

DETAILED DESCRIPTION OF THE INVENTION

Figure 1:
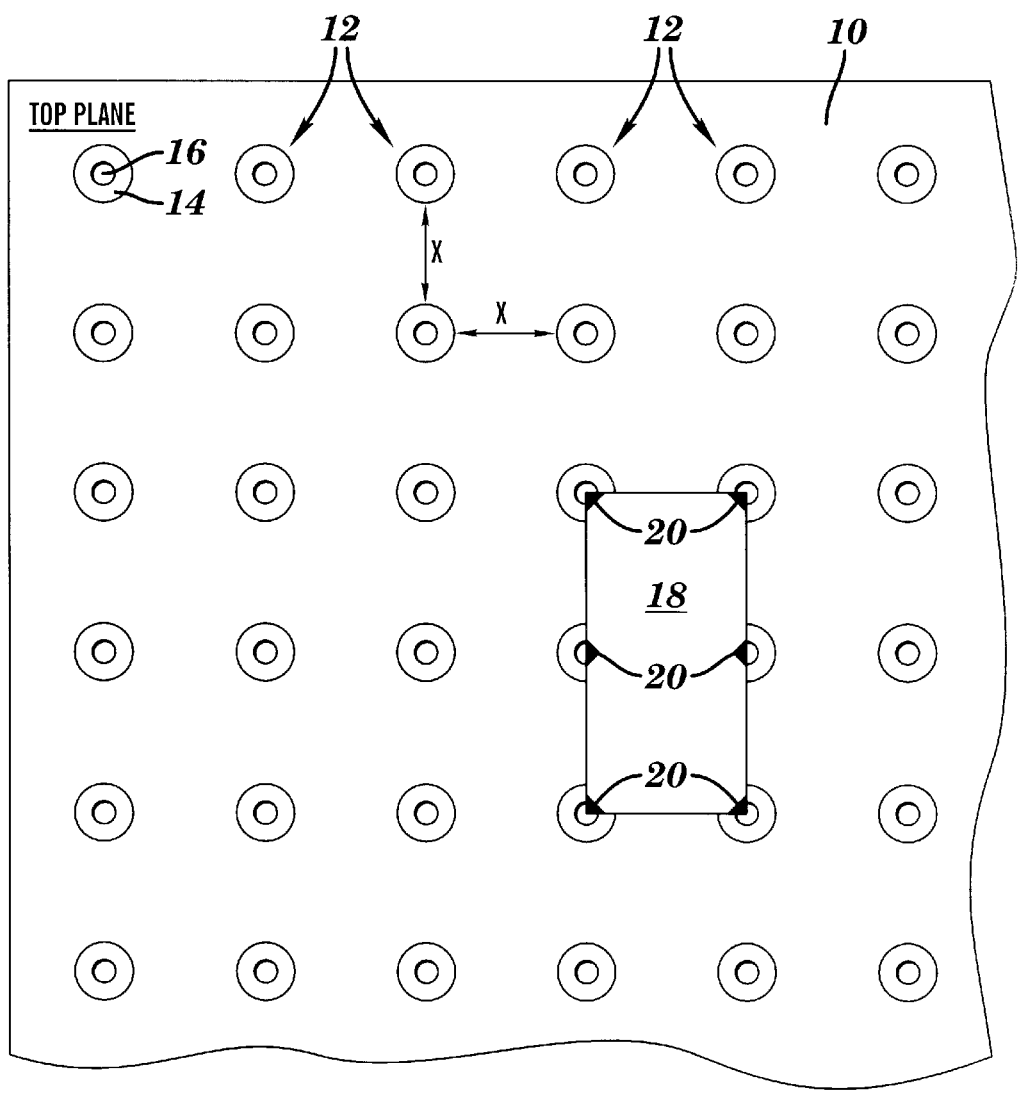
FIG. 1 depicts a top plane of a printed circuit board.
Figure 2:
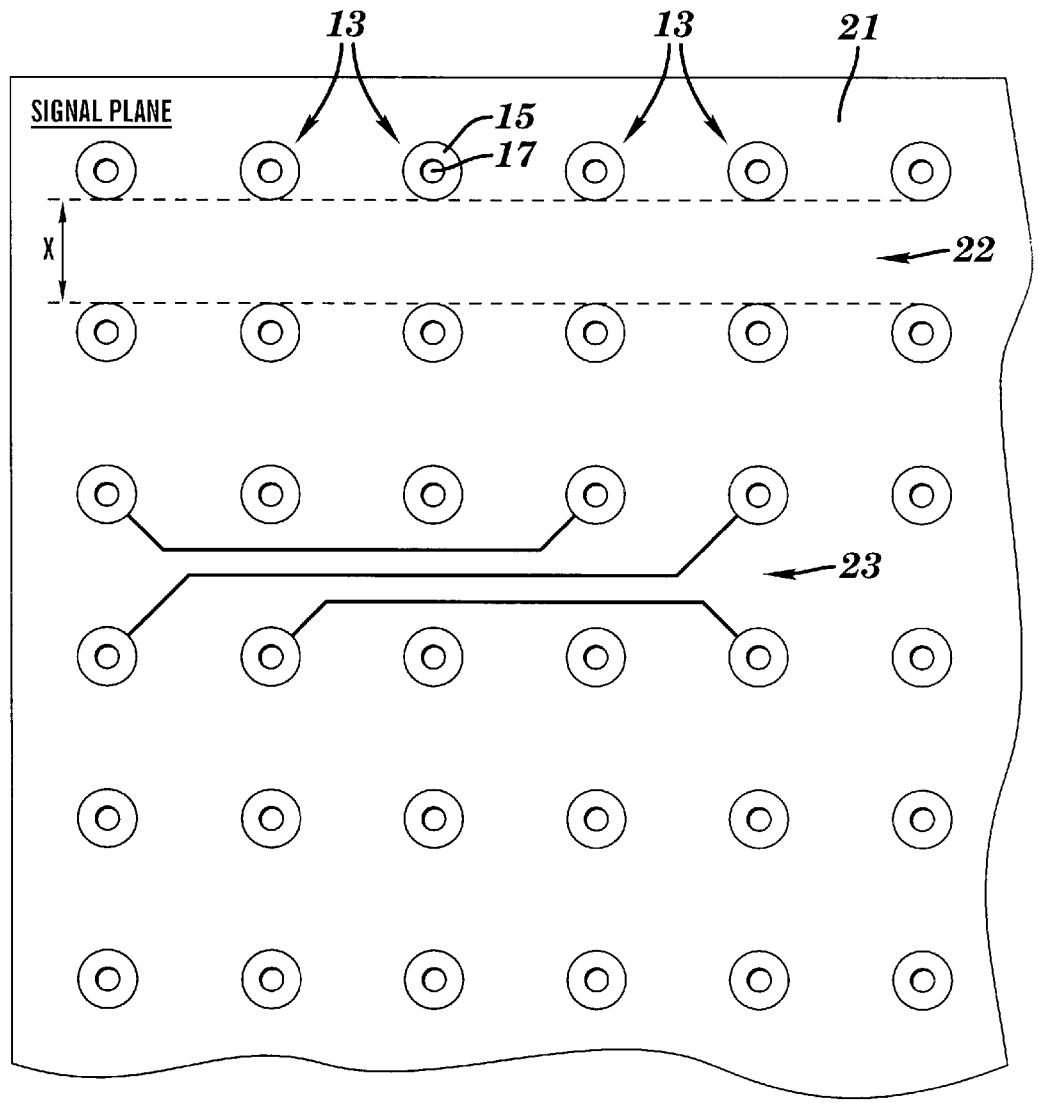
FIG. 2 depicts a signal plane of the printed circuit board of FIG. 1.
Figure 3:
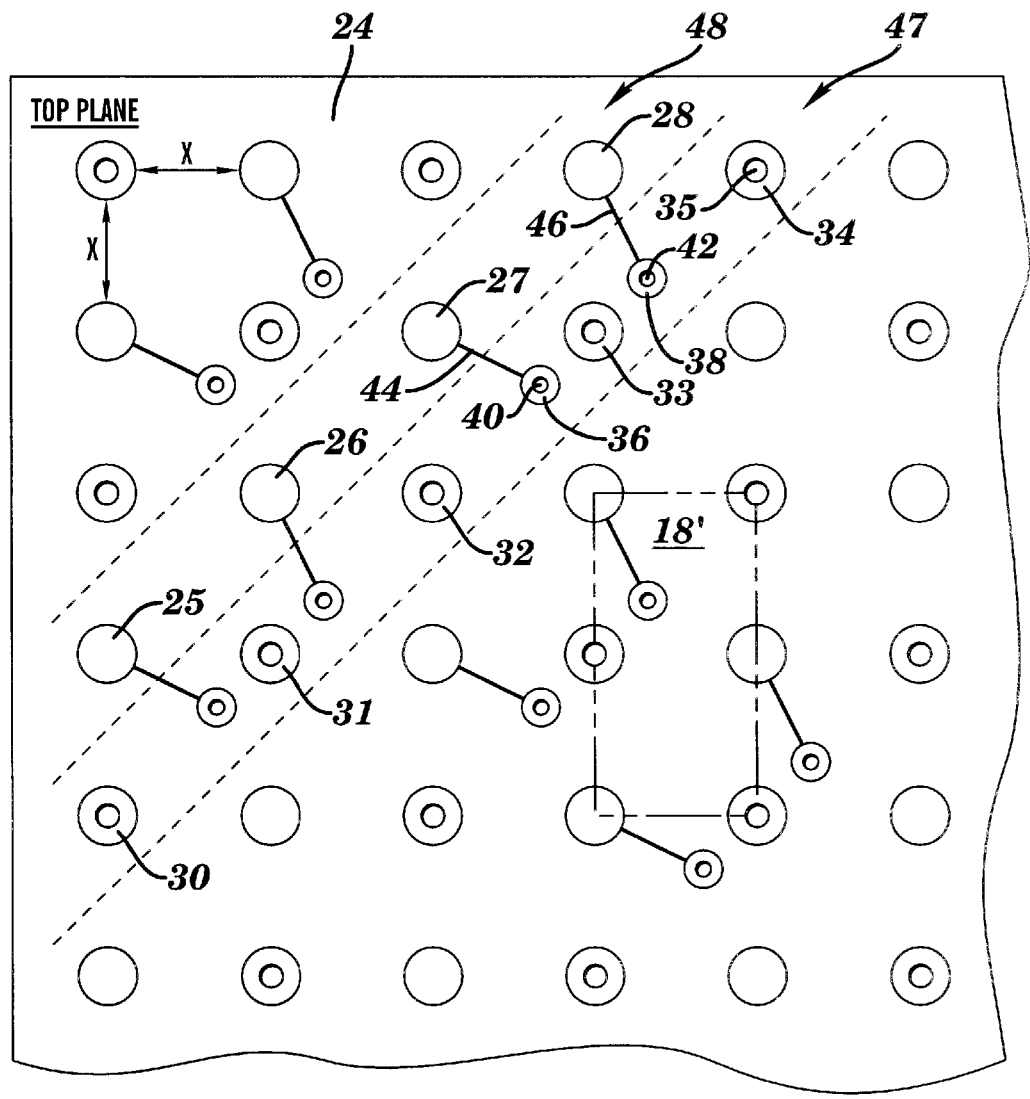
FIG. 3 depicts a top plane of an improved circuit board in accordance with a preferred embodiment of the present invention.
Figure 4:
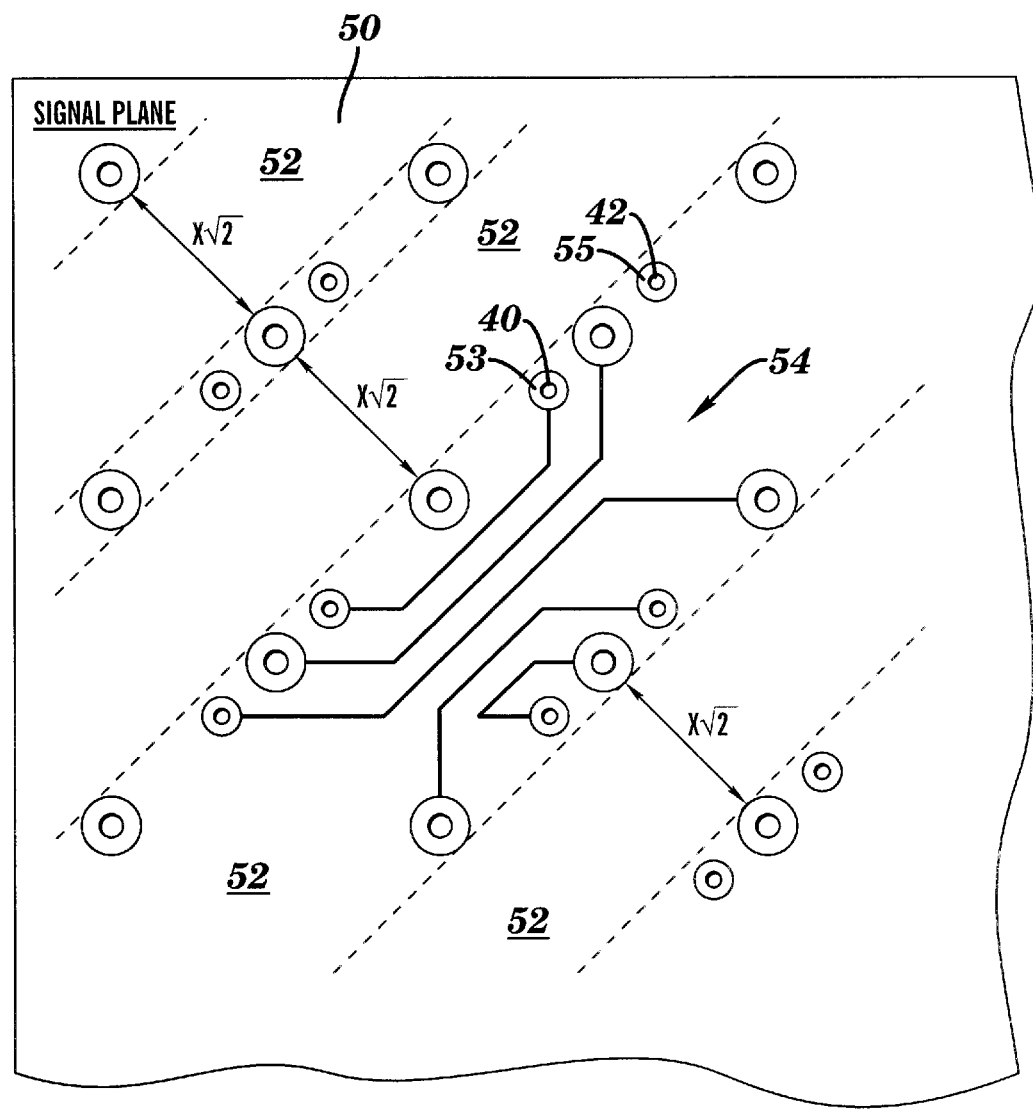
FIG. 4 depicts a signal plane corresponding to the top plane of FIG. 3 in accordance with a preferred embodiment of the present invention.
Figure 5:
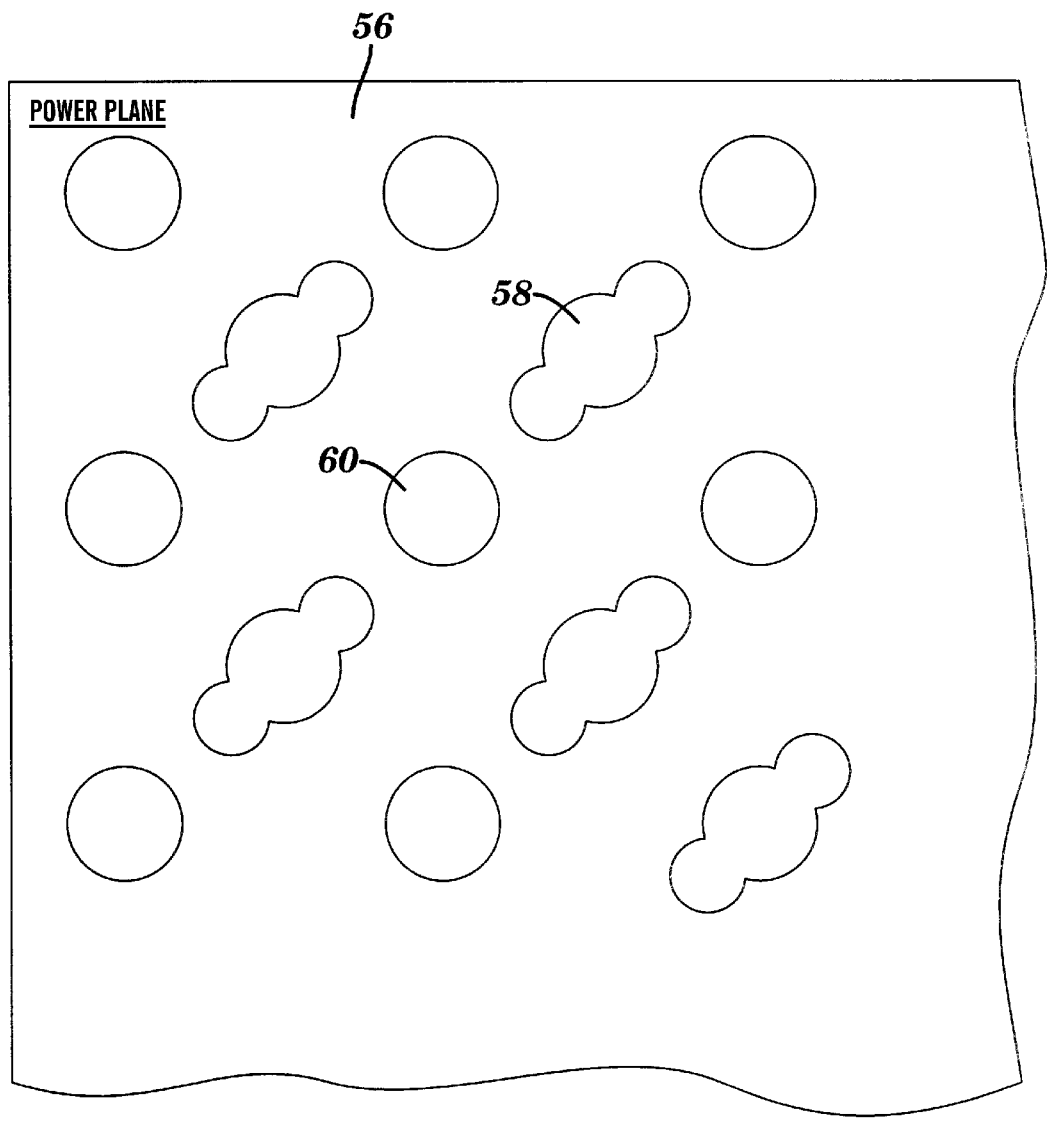
FIG. 5 depicts a power plane corresponding to the signal plane and top plane of FIGS. 2 and 3 in accordance with a preferred embodiment of the present invention.

Referring to FIGS. 3–5, a simplified version of a multi-layer PCB is depicted having a top plane 24, a signal plane 50, and a power plane 56. It is understood that multilayer PCB's may be implemented with additional layers (e.g., multiple power and signal planes) and configurations, and such implementations are within the scope of this invention. Referring now to FIG. 3, a top plane 24 of a simple PCB in accordance with a preferred embodiment of this invention is depicted. The top plane 24 includes a plurality of component lands (e.g., 25–28 and 30–34) arranged in a grid-like manner for receiving components of a predetermined geometry similar to that shown in FIG. 1. The PCB may comprise a BGA structure, or any other structure that utilizes surface lands for the attachment of components. The top plane 24 further comprises a plurality of offset or auxiliary lands (e.g., 36 and 38) and a plurality of electrical connectors (e.g., 44 and 46) connecting certain ones of the component lands to certain ones of the offset lands. In the preferred embodiment depicted in FIG. 3, the component lands are grouped into adjacent diagonals 47, 48, each having lands suitable for receiving a component. In the first diagonal 47, each of the component lands 30, 31, 32, 33 and 34 may include a vertical connector 35 for delivering electrical signals to the planes below the top plane 24. The vertical connectors 35 may comprise a via, PTH, or any other type of vertical connection system. The second diagonal 48 comprises a group of component lands, 25, 26, 27 and 28 that do not include vertical connections. Thus, the component lands in the second diagonal 48 do not include direct vertical connections to adjacent planes. Instead, a system of offset lands 36 and 38 are utilized to provide vertical connections at offset locations. By offsetting the vertical connections for the component lands in the second diagonal 48, more robust wiring can be achieved and implemented at the signal plane level.

Accordingly, in the preferred embodiment, signals are delivered between component lands in the second diagonal 48 and corresponding lands on adjacent planes (e.g., a signal plane) with (1) offset lands 36, 38 on the top plane 24, (2) electrical connectors 44, 46 (residing on the same horizontal plane as the top plane 24) connecting the component lands 27, 28 to the offset lands 36, 38, and (3) vertical connections 40, 42 connecting the offset lands 36, 38 to the corresponding lands 53, 55 on an adjacent plane (see FIG. 4).

As such, the second diagonal 48 provides operational component lands for receiving components of a standard geometry, but does not provide direct vertical connections to adjacent planes. Instead, electrical connections are shifted over or offset into the first diagonal 47, where their signals can be routed in a vertical direction. Therefore, from the componentry standpoint, no changes are required since top plane 24 can still receive components of a standard geometry, such as component 18' shown in phantom. Thus, standard BGA land arrangements and the like may still be utilized.

The advantages of offsetting the vertical connections from second diagonal 48 to first diagonal 47 are evident in FIG. 4, which depicts the corresponding signal plane 50 for the top plane 24 of FIG. 3. With the aforementioned alteration to the top plane 24, the corresponding signal plane 50 will comprise a plurality of diagonal channels 52 that have a usable channel width of $x\sqrt{2}$, as compared to the prior art, which provided a usable channel width of just "x" (x being the distance between adjacent component lands on the corresponding top plane 24). Thus, signal plane 50 comprises channels 52 having a greater wiring density since a greater number of wires 54 can be run in the channels 52 on the signal plane 50.

Referring back to FIG. 3, it can be seen that the offset lands (e.g., 36 and 38) are clustered around every other component land 31 and 33 in the first diagonal 47. The result is a first diagonal having a single component land 30, an adjacent cluster of three lands including component land 31, a single component land 32, a second cluster of three lands including component land 33, a single component land 34, etc. By clustering the lands in such a manner, performance on the power plane is maintained in a manner explained below.

FIG. 5 depicts a power plane 56 corresponding to the top plane 24 of FIG. 3 and signal plane 50 of FIG. 4. The power plane 56 is generally a sheet of conductive material used to provide electrical power to predetermined component lands on the top plane or signal lands on the signal plane. Power is delivered with the use of vias and PTH's (not shown) to those points where power is required. Because the power plane 56 may be sandwiched between signal planes, the power plane 56 must include numerous clearance holes 58, 60 to allow for the unimpeded passage of vertical connectors (e.g., vias and PTH's) that deliver signals between signal planes and the top plane. In particular, the clearance holes 58, 60 must be large enough to guard against inadvertent electrical short circuits between the power plane 56 and vertical connectors carrying signals that must pass through the plane 56. Thus, a typical power plane will look much like a slice of "swiss cheese" having numerous holes drilled therethrough to provide this necessary clearance. However, too many holes in the plane 56, or in a portion of the plane 56, will decrease the dielectric properties of the plane 56 and result in decreased performance.

By clustering the offset lands 36, 38 with the component lands 31, 33 in the first diagonal 47 on the top plane 24, the resultant clearance holes 58, 60 on the power plane take up less area due to the fact that the clearance holes will overlap and create a single triplet hole 58. The advantage of having such a triplet hole 58 (versus a plurality of equally spaced signal holes) is that the power plane 56 retains a greater surface area of conductive material. This arrangement results in a more uniform power plane with greater mechanical integrity and better capacitive characteristics. If for instance the power plane were to have a plurality of single holes 60, rather than the triplets 58, the capacitive value of the power plane would decrease creating a potential loss of electrical signals on the board. By grouping the holes in such manner, the dielectric properties of the power plane 56 are retained.

The foregoing description of the preferred embodiments of the invention have been presented for purposes of illustration and description. They are not intended to be exhaustive or to limit the invention to the precise form disclosed, and obviously many modifications and variations are possible in light of above teachings. For example, this invention need not be implemented to create diagonal channels on the signal plane, but could be implemented to create user defined channels of varying dimensions and shapes. Moreover, the clustering of lands could be done with various numbers of lands and different positioning to achieve a specific need of a PCB. Such modifications and variations that may be apparent to a person skilled in the art are intended to be included within the scope of this invention as defined by the accompanying claims.

What is claimed is:

1. A printed circuit board, comprising:
   a top plane having a plurality of component lands arranged in a grid, wherein the plurality of component lands includes a first grouping of component lands including connectors that extend to a second plane and being in a first diagonal, wherein the second plane is parallel to the top plane, and a second grouping of component lands being in a second diagonal and not including connectors that extend to the second plane, wherein the second diagonal is parallel and adjacent to the first diagonal;
   a plurality of offset lands including connectors that extend to the second plane placed along the first diagonal and between the component lands in the first diagonal; and
   a plurality of electrical connectors electrically coupling the component lands in the second diagonal to the offset lands in the first diagonal.

2. The printed circuit board of claim 1, wherein the first diagonal includes a cluster of three lands comprising two of the offset lands and one of the component lands.

3. The printed circuit board of claim 2, further comprising a power plane that includes a plurality of overlapping holes residing directly beneath the cluster of lands.

4. The printed circuit board of claim 1, wherein every other component land in the first diagonal is adjacent to a first and second offset land placed on either side of the component land.

5. The printed circuit board of claim 1, wherein the second plane has a diagonally oriented wiring channel directly below the second diagonal of the top plane.

6. The printed circuit board of claim 1, wherein one or more offset vias corresponding to component lands of the second grouping of component lands are clustered nearer to a via corresponding to a particular component land of the first grouping of component lands than to a via corresponding to any other component land of the first grouping of component lands.

7. The printed circuit board of claim 1, wherein the first diagonal includes a cluster of connectors extending to the second plane, wherein two connectors corresponding to component lands of the second grouping of component lands are clustered adjacent a single connector corresponding to a component land of the first grouping of component lands, and the connector corresponding to a component land of the first grouping of component lands is between the two connectors corresponding to component lands of the second grouping of component lands.

8. A multi-planed wiring board, comprising:
   a signal plane having a plurality of signal lands positioned for enhanced wireability;
   a top plane located in a coplanar manner above the signal plane and having a plurality of component lands positioned in a grid pattern array for receiving at least one component, wherein each component land of the plurality of component lands on the top plane has a corresponding signal land on the signal plane;
   wherein said signal lands comprise first and second subsets of signal lands, the first subset of signal lands having the same number of signal lands as the second subset of signal lands and being arranged in the grid pattern of the corresponding component lands, the second subset of signal lands being positioned in the interstices of the grid pattern of the first subset of signal lands;
   an auxiliary land located on the top plane and residing directly above a horizontally offset signal land of the second subset of the signal lands; and
   a horizontal connection on the top plane electrically coupling the auxiliary land to its corresponding component land.

9. The multi-planed wiring board of claim 8, wherein the plurality of component lands are arranged in an orthogonal grid pattern array and have a distance between adjacent component lands.

10. The multi-planed wiring board of claim 9, wherein the plurality of signal lands are arranged to form at least one channel having a width greater than the distance between adjacent component lands in the orthogonal grid pattern array.

11. The multi-planed wiring board of claim 8, further comprising a vertical connection electrically coupling the auxiliary land to the horizontally offset signal land.

12. The multi-planed wiring board of claim 11, wherein the vertical connection is a plated through hole.

13. A printed circuit board, comprising:
   a plurality of component lands located in an orthogonal grid pattern array having unit dimension x between adjacent component lands, on a top plane of the printed circuit board for receiving components;
   a plurality of signal lands arranged on a signal plane, the plurality of signal lands being electrically connected with corresponding ones of the component lands;
   wherein a first subset of the plurality of signal lands are offset from the locations of the corresponding plurality of component lands on the top plane to a set of offset locations; and
   wherein each signal land of a second subset of the plurality of signal lands is arranged in an orthogonal grid pattern array having the same unit dimension x as the orthogonal grid pattern array of the component lands; and
   wherein each offset location of the first subset of the plurality of signal lands is aligned within a diagonal running through two or more diagonally adjacent signal lands of the second subset of the plurality of signal lands.

14. The printed circuit board of claim 13, wherein two signal lands of the first subset of the plurality of signal lands are located closer to a particular signal land of the second subset of the plurality of signal lands than to any other signal land of the second subset of the plurality of signal lands to form a cluster of three lands on any plane.

15. The printed circuit board of claim 14, further comprising a power plane, wherein the power plane includes a clearance hole that contains the cluster of three lands.

16. The printed circuit board of claim 13, wherein each signal land of the second subset of the plurality of signal lands is covered by a component land on the top plane.

17. The printed circuit board of claim 16, wherein the signal lands of the first subset of signal lands and of the second subset of signal lands are arranged to form at least one diagonally oriented channel having a width greater than the distance between adjacent component lands arranged in the orthogonal grid pattern array on the top plane.

18. The printed circuit board of claim 13, wherein all signal lands of the second subset of the plurality of signal lands are horizontally offset in the same direction and the same distance from a corresponding subset of the plurality of component lands arranged in an orthogonal grid array on a top plane of the printed circuit board.

* * * * *